(12) United States Patent
Benzel et al.

(10) Patent No.: US 7,045,382 B2
(45) Date of Patent: May 16, 2006

(54) METHOD FOR PRODUCING MICROMECHANIC SENSORS AND SENSORS PRODUCED BY SAID METHOD

(75) Inventors: Hubert Benzel, Pliezhausen (DE);
Heribert Weber, Nuertingen (DE);
Hans Artmann, Magstadt (DE); Frank Schaefer, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/472,650

(22) PCT Filed: Mar. 13, 2002

(86) PCT No.: PCT/DE02/00883

§ 371 (c)(1),
(2), (4) Date: Mar. 26, 2004

(87) PCT Pub. No.: WO02/076880

PCT Pub. Date: Oct. 3, 2002

(65) Prior Publication Data

US 2004/0152228 A1   Aug. 5, 2004

(30) Foreign Application Priority Data

Mar. 22, 2002 (DE) ................. 101 14 036

(51) Int. Cl.
*H01L 21/00* (2006.01)
(52) U.S. Cl. ............... 438/50; 438/422; 438/719
(58) Field of Classification Search ............ 438/50, 438/422, 719, 735, 738, 715; 257/415
See application file for complete search history.

(56) References Cited

U.S. PATENT DOCUMENTS

| 4,993,143 A | 2/1991 | Sidner et al. |
| 5,241,615 A | 8/1993 | Amos et al. ................. 385/126 |
| 5,690,841 A | 11/1997 | Elderstig ..................... 216/39 |
| 5,834,333 A * | 11/1998 | Seefeldt et al. ............... 438/52 |

(Continued)

FOREIGN PATENT DOCUMENTS

| DE | 3 723 561 | 1/1988 |
| DE | 4 318 466 | 12/1994 |
| EP | 1 043 770 | 10/2000 |
| JP | 60-92671 | 4/1994 |
| JP | 8-236782 | 9/1996 |

OTHER PUBLICATIONS

Mizushima et al., Applied Physics Letter, vol. 77, No. 20, Nov. 13, 2000, p. 3290-2.

(Continued)

*Primary Examiner*—Caridad Everhart
(74) *Attorney, Agent, or Firm*—Kenyon & Kenyon LLP

(57) ABSTRACT

Proposed is a method for manufacturing micromechanical sensors and sensors manufactured by this method, where openings are introduced into a semiconductor substrate. After the openings are introduced into the semiconductor substrate, a subsequent temperature treatment is carried out, in which the openings are converted into voids in the depth of the substrate.

9 Claims, 4 Drawing Sheets

U.S. PATENT DOCUMENTS

| | | |
|---|---|---|
| 5,840,597 A | 11/1998 | Hartauer |
| 6,038,928 A | 3/2000 | Maluf et al. |
| 6,076,404 A | 6/2000 | Offenberg et al. |
| 6,190,571 B1 | 2/2001 | Kato |
| 6,570,217 B1 * | 5/2003 | Sato et al. ............... 257/327 |
| 6,743,654 B1 * | 6/2004 | Coffa et al. ............... 438/52 |

OTHER PUBLICATIONS

Mizushima et al., "Empty-Space-In-Silicon Technique For Fabricating A Silicon-On-Nothing Structure," Nov. 13, 2000, pp. 3290-3292, vol. 77, No. 20, Applied Physics Letters.

* cited by examiner

METHOD FOR PRODUCING MICROMECHANIC SENSORS AND SENSORS PRODUCED BY SAID METHOD

FIELD OF THE INVENTION

The present invention relates to a method for manufacturing micromechanical sensors and micromechanical sensors produced by it.

BACKGROUND INFORMATION

An article of Mizushima et al., Applied Physics Letter, Vol. 77, No. 20, Nov. 13th, 2000, page 3290 ff., already describes a method, in which voids are produced in the semiconductor substrate by introducing openings and carrying out a subsequent temperature treatment. However, these structures are only intended to be used in integrated circuits. A multitude of other manufacturing processes, in particular the so-called sacrificial-layer technique, are known for manufacturing sensors. In this context, a silicon layer is produced on a sacrificial layer. The sacrificial layer is then removed again after the silicon layer is patterned.

SUMMARY OF THE INVENTION

The method of the present invention has the advantage over the background art, that a particularly simple method for manufacturing micromechanical sensors is specified. In this context, the micromechanical sensors constitute sensor elements, which are made of monocrystalline silicon. The method is also suitable for the integration of circuit elements.

In order to ensure that a void is reliably produced, the introduced openings should be deeper than the diameter. They should preferably have a diameter of less than 1 μm and be deeper than 2 μm. Sufficiently high temperatures ensure that the mobility of the silicon atoms on the substrate is sufficient. The actual sensor elements are then formed by further processing steps. In this context, the deposition of an epitaxy layer and the introduction of dopants are advantageous.

DETAILED DESCRIPTION

Figure 1:
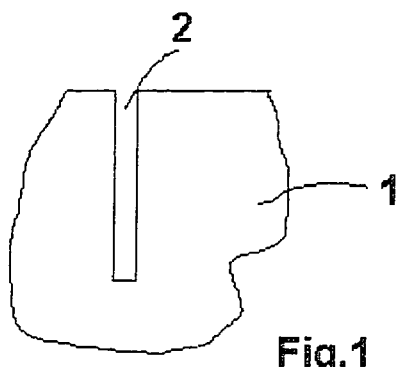
FIGS. 1 through 4 show a first process sequence.

A process sequence elucidating the method of the present invention is shown in FIGS. 1 through 4. Shown in FIG. 1 is a cross-section of a silicon substrate 1, into which an opening 2 is introduced. Opening 2 takes the form of a long, thin, blind hole, which typically has a diameter of less than 1 μm and extends more than 1 μm into the depth of silicon substrate 1. Silicon substrate 1 is, in particular, a monocrystalline silicon substrate. Such openings may be produced by reactive ion etching, i.e. irradiating the surface of silicon substrate 1 with ions of a gas, which form a gaseous chemical compound with the silicon material. Usually, the part of the surface of silicon substrate 1 that should not be etched is protected by a masking of, for example, silicon oxide, silicon nitride, metals, or glass layers. A purely ablative, plasma-etching method may also be used as an alternative.

Figure 2:
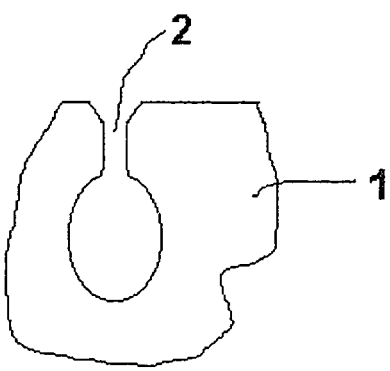
Figure 3:
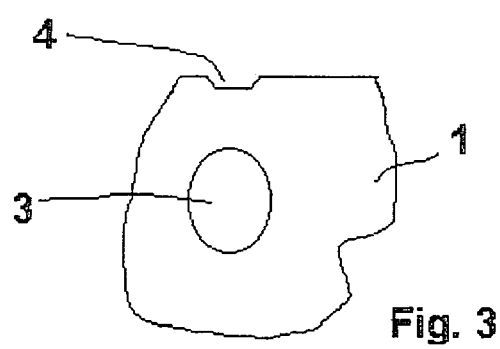
Figure 4:
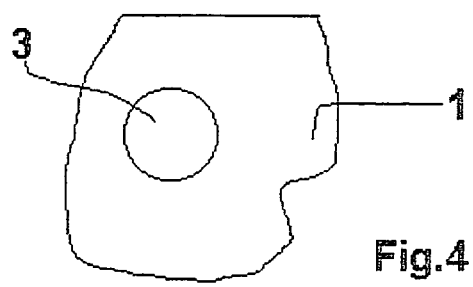

Silicon substrate 1, whose cross-section in shown in FIG. 1, is then subjected to a temperature treatment. In this context, temperatures at which silicon atoms can be rearranged, i.e. temperatures greater than 900° C., are selected. For example, a temperature treatment of 1100° C. is particularly suitable. Such a temperature treatment is preferably carried out in a hydrogen atmosphere, since, in this case, oxide forming on the surface of silicon 1 may be removed from the surface of silicon 1 and from the walls of opening 2. The high temperatures increase the mobility of the silicon atoms, so that a rearrangement occurs in such manner, that the surface area of the silicon is reduced. As can be seen in FIG. 2, the result of this is that the diameter of opening 2 decreases in the upper region of opening 2, i.e. in the region very near the surface of silicon substrate 1, and a hollow forms in the lower region of opening 2. When this method is continued for a while, the situation shown in FIG. 3 occurs, i.e. a slight depression is still present on the surface of silicon substrate 1, while a void 3 is formed in the interior of silicon substrate 1. However, such a void 3 is only formed, when opening 2, as shown in FIG. 1, is sufficiently deep and sufficiently narrow. Otherwise, in order to minimize the surface tension, it is energetically more favorable when only a depression 4 is formed. Consequently, opening 2 must be sufficiently deep, and the cross-sectional area must be sufficiently small. It is at least necessary for the depth of opening 2 in silicon substrate 1 to be greater than the diameter of opening 2 at the surface. In FIG. 3, a minimum state with regard to the surface area is not yet reached. The surface of silicon substrate 1 still has a depression 4, and void 3 still has an oval shape. However, this state is further changed by continuing the temperature treatment, and a nearly spherical void 3 is then formed, over which there is also no more depression 4. This state is shown in FIG. 4.

Therefore, it is possible to produce a void 3 in a silicon substrate 1, by introducing an opening 2 and carrying out a subsequent temperature treatment.

The method of the present invention is not limited to monocrystalline silicon, but may equally be implemented in other semiconductor materials, such as GaAs. In addition, polycrystalline semiconductor material may also be used. Semiconductors have the advantage that conductive and nonconductive regions necessary for the manufacturing of sensors may be produced by further processing steps.

When only hydrogen is trapped in the void, then an effective vacuum is produced by a further temperature treatment, since the hydrogen easily diffuses out through the silicon. This is especially of interest for pressure sensors, since a reference vacuum is consequently produced. Further temperature treatments are accomplished, for example, by introducing and heat-treating dopants.

Figure 5:
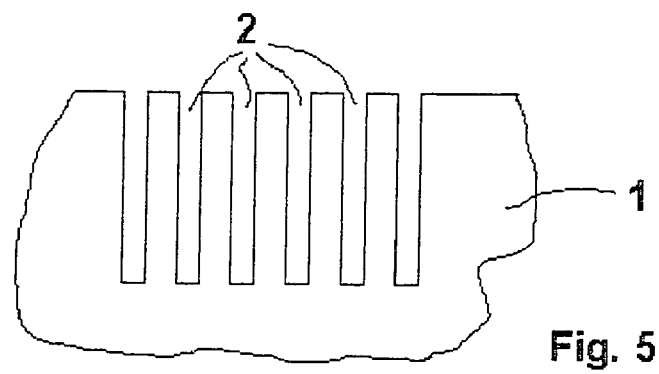
FIGS. 5 through 8 show a further process sequence for producing voids.
Figure 6:
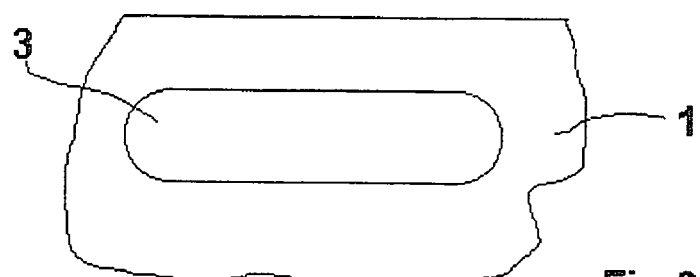
Figure 7:
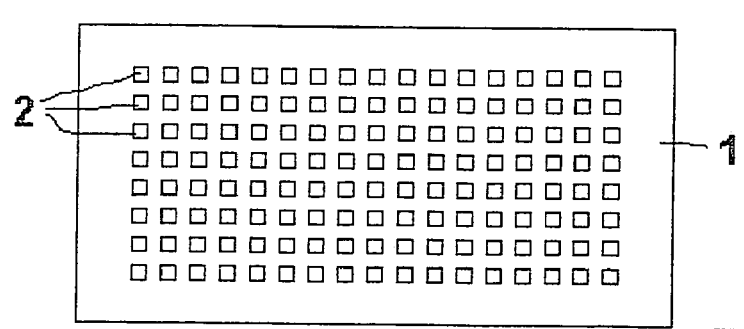
Figure 8:
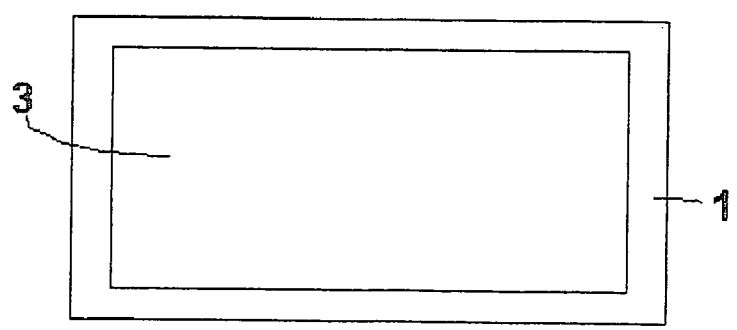

FIGS. 5 through 8 show how this method may produce a membrane that is situated over a void. Shown in FIG. 5 is a cross-section of silicon substrate 1, in which several openings 2 taking the form of narrow, deep, blind holes are introduced. A plan view of the substrate according to FIG. 5 is shown in FIG. 7. As can be seen in FIG. 7, several openings 2 are spaced in close proximity to each other, the spacing of openings 2 approximately corresponding to the diameter of openings 2. When FIGS. 5 and 7 are used as a starting point and a temperature treatment is carried out, silicon atoms are rearranged in each opening 2, as was described with regard to FIGS. 1 through 4. The result is a connected, large-area void 3, as is shown in FIG. 6 in a cross-section of silicon substrate 1. A membrane region 4, which is made up of a thin layer of silicon, is situated above areal void 3. When silicon substrate 1 is a monocrystalline silicon substrate, then this membrane 4 is formed, in turn, by monocrystalline silicon, since, during the rearrangement, the silicon atoms position themselves at the proper crystal-lattice places. Therefore, the monocrystalline structure of silicon substrate 1 is also maintained in membrane region 4 over void 3. FIG. 8 shows a plan view, in which case it is clear that void 3 cannot be seen in a plan view. Therefore, areal void 3 represented in FIG. 8 may not be seen in the plan view but is nevertheless shown in FIG. 8, in order to give an idea of how a void 3 is formed in the depth of the silicon substrate, starting out from visible openings 2 in FIG. 7.

In the configuration of openings 2, as is shown in FIGS. 5 and 7, there is a correlation between the diameter of openings 2, the spacing of openings 2, and the depth of openings 2. The deeper openings 2 are put into silicon substrate 1, the greater the distance may be between adjacent openings 2 in FIG. 7 in order to still produce a continuous void 3, as is shown in FIG. 8. If necessary, the exact size ratios of the diameter of openings 2, the spacing of openings 2 with respect to each other, and the depth of openings 2 must be determined experimentally and may also be a function of further parameters, such as the temperature of the temperature treatment, any introduced dopants, the composition of a protective gas during the temperature treatment, and the like.

However, in order to attain sensor patterns from the method described in FIGS. 1 through 8, further processing of silicon substrate 1 is necessary.

Figure 9:
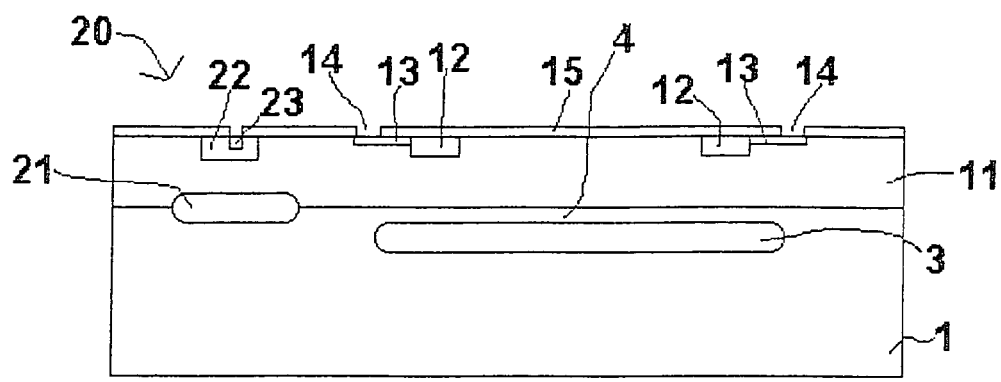
FIG. 9 shows a first example of a sensor according to the present invention.

FIG. 9 shows a first example of a sensor according to the present invention, which starts out from a silicon substrate 1, as is represented in FIGS. 6 and 8. Silicon substrate 1 has a void 3 and a membrane region 4 situated above it. Starting out from silicon substrate 1, as is shown by way of example in FIGS. 6 through 8, an epitaxy layer 11 is applied which covers the entire upper side of silicon substrate 1, including membrane region 4. Since silicon substrate 1 is monocrystalline and the monocrystalline silicon structure is also present in the region of membrane 4, epitaxy layer 11 grows in a monocrystalline manner. Typical thicknesses of such an epitaxy layer 11 are on the order of several μm to several tens of μm. Dopants are then introduced on the upper side of epitaxy layer 11, using customary methods. For example, doping zones 12 may be introduced for piezoresistive resistor elements, which are then connected to contact openings 14 of a passivation layer 15 by highly doped lead zones 13. In this context, piezoresistive resistor elements 12 are positioned to be situated in epitaxy layer 11 in the edge regions of void 3. Using highly doped lead elements 13, electrical signals may then be tapped at contact openings 14, via metallic conductor tracks (not shown). In particular, the electrical resistance of piezoresistive elements 13 may be measured. Because of their positioning relative to void 3, piezoresistive elements 12 are in regions in which considerable mechanical stresses occur, in case epitaxy layer 11 and membrane region 4 deform above void 3. Such deformation may occur, for example, because the ambient pressure deviates from the pressure trapped in void 3. Therefore, a device is provided, which detects a change in the ambient pressure relative to the pressure in void 3, i.e. it is a pressure sensor. Using metallic conducting layers on the upper side of passivation layer 15, the electrical signals of piezoresistive elements 12 may be supplied to an evaluation circuit 20, which is likewise formed in epitaxy layer 11 and silicon substrate 1. For reasons of simplification, the metallic conductor tracks on the upper side of passivation layer 15 are not shown. In the same way, the electrical evaluation circuits are only indicated by diffusion zones 21, 22, and 23 and are by no means equivalent to real circuit elements. Due to buried doping zone 21, dopant has already been introduced into the upper side of silicon substrate 1 prior to the deposition of epitaxy layer 11. Doping zones 22 and 23 are customary doping zones introduced during the production of customary semiconductor elements. In this context, processes are used which are also used for producing piezoresistive elements 12 and highly-doped leads 13. The method of the present invention for producing void 3 may easily be used with customary methods for producing semiconductor patterns, so that both voids 3 and customary circuit elements 20 may be produced in one and the same process sequence.

Figure 10:
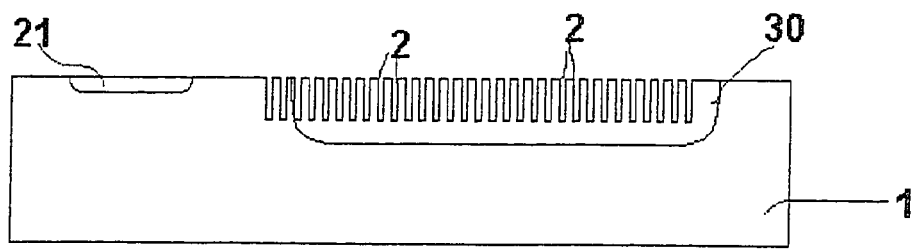
FIGS. 10 through 12 shows further process steps for producing a second example of a sensor according to the present invention.
Figure 10:
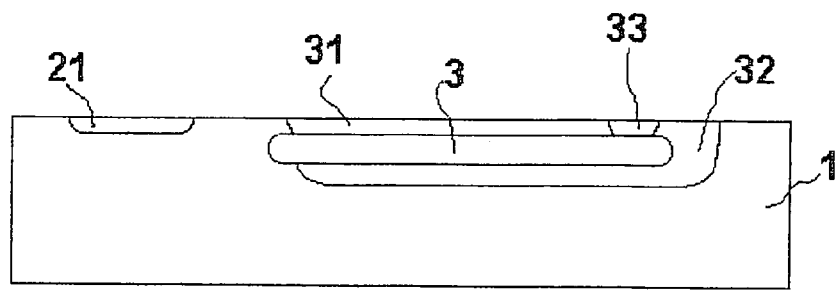
Figure 11:
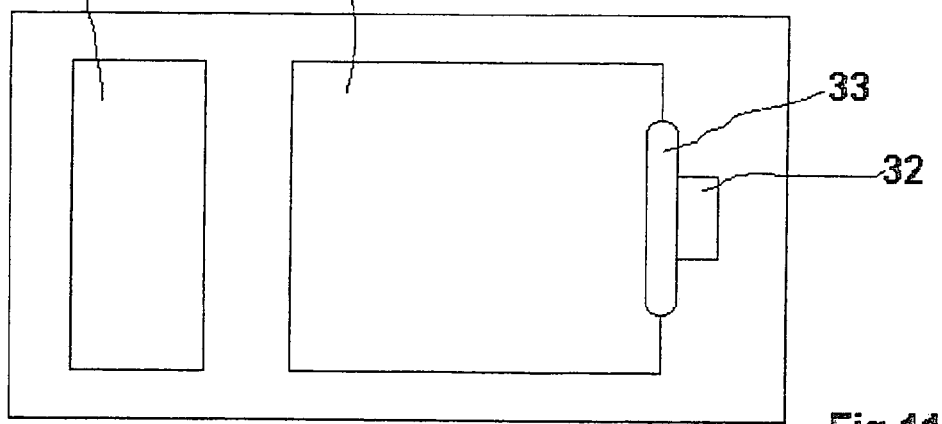
Figure 12:
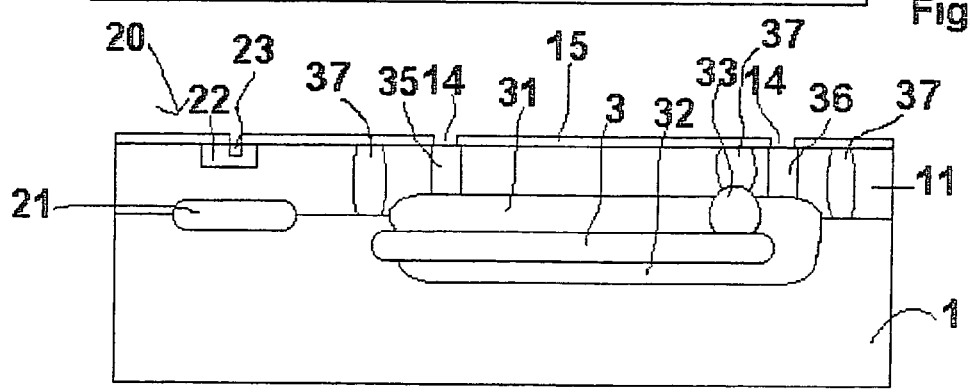

An additional manufacturing process for a pressure sensor is shown in FIGS. 10, 11, and 12. However, in addition to the method steps described in FIGS. 1 through 8, dopant is also introduced into silicon substrate 1 before and after the production of void 3. In this context, one starts out from a homogeneously doped silicon substrate, e.g. a p-doped silicon substrate, in which an opposite type of doping 30, e.g. n-doping, is then introduced. Openings 2 are then introduced, as shown in FIGS. 5 through 7. The region in which openings 2 are situated extends into both p-doped substrate 1 and introduced n-doping 30. The depth of openings 2 is less than the depth of doping 30, so that doping 30 is still found under openings 2. This state is shown in FIG. 10a. The temperature treatment then produces a void 3, which extends into the interior of substrate 1 and horizontally cuts through introduced n-doping 30, so that the silicon above and below void 3 is n-doped. As it were, void 3 cuts through the doping region in the horizontal direction. This produces upper doping 31 and lower doping 32. By introducing a re-doping zone 33 into the n-doped zones, i.e. by introducing a large number of p-dopants, upper n-doping 31 and lower n-doping 32 may then be electrically insulated from each other. Shown in FIG. 10b is a cross-section of silicon substrate 1 produced in this manner, where upper n-doping 31 is electrically insulated from lower n-doping 32 by void 3 and redoping zone 33. FIG. 11 shows a plan view of FIG. 10b. As is apparent, redoping 33 is positioned in such a manner, that it is electrically situated between n-doping 32 and n-doping 31. Alternatively, redoping 33 may also be positioned in such a manner, that it completely surrounds upper n-doping 31. In addition, FIGS. 10 and 11 also show a doping zone 21 for a buried doping zone, which is customary for the production of bipolar circuits.

Starting out from FIGS. 10 and 11, an n-doped epitaxy layer 11 is then applied, in order to produce a sensor element. In this context, deep contacting areas 35 und 36, which are also n-doped, are introduced into epitaxy layer 11. In this case, deep contacting area 35 is positioned in such a manner, that upper n-doping 31 is electrically contacted, and deep contacting area 36 is positioned in such a manner, that lower n-doping 32 is electrically contacted. P-doped insulating rings 37 are produced around deep contacting area 36 and around upper n-doping 31 to provide mutual electrical insulation. A passivation layer 15, into which contact openings 14 are introduced, is then applied to the upper side again. Contact openings 14 are placed in such a manner, that deep contacting areas 35 are contacted by metallic surface films not shown, so that an electrical surface connection may be made to circuit elements 20, which are likewise formed in semiconductor substrate 1 and epitaxy layer 11. Semiconductor circuit elements 20 are, in turn, only schematically represented by buried doping zone 21 and further doping zones 22 und 23.

The device shown in FIG. 12 represents a capacitive pressure sensor. In the event of a pressure difference between void 3 and the surroundings, epitaxy layer 11 and the region of semiconductor substrate 1 situated above void 3 deform. This changes the distance between upper doping zone 31 and lower doping zone 32. Since these two zones are electrically insulated from each other, they form a plate-type capacitor, whose capacitance is a function of the spacing of doping zones 31 and 32. Deep contacting areas 35 and 36 allow this capacitance to be detected by an appropriate evaluation circuit. The level of deformation of epitaxy layer 11 and semiconductor substrate 1 may be inferred by measuring the capacitance, and, in this manner, the ratio of the ambient pressure to the pressure in void 3 may be determined. The capacitive measuring principal is particularly advantageous, since it is especially independent of temperature. In addition, the capacitances may be evaluated in a particularly effective manner by circuits situated in the immediate vicinity.

Figure 13:
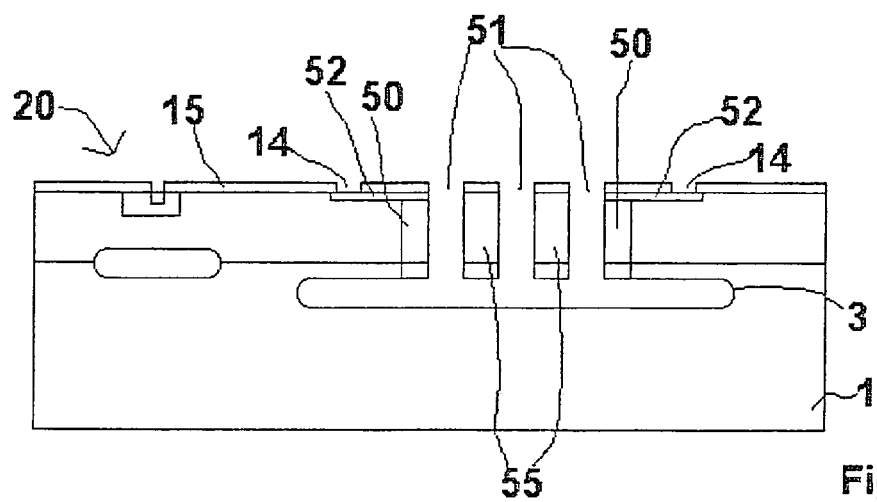
FIG. 13 shows a further example of a sensor according to the present invention.

A further exemplary embodiment of a sensor according to the present invention is shown in FIG. 13. Using a substrate 1 represented in FIGS. 6 and 8 as a starting point, an epitaxy layer 11 is applied. In this context, a region above membrane 3 is provided with a high level of doping 50, so that epitaxy layer 11 is highly conductive in this region. In addition, high surface dopings 52 are introduced, which are used as electrical leads to contact holes 14 in a passivation layer 15. Trenches 51 are subsequently introduced by an etching process, which extends from the upper side of epitaxy layer 11 to void 3. In this manner, beam structures 55 are produced, which may be geometrically designed to be, for example, movable by an acceleration parallel to the surface of substrate 1. In addition, measures for insulating these beam structures 55 among themselves and with respect to epitaxy layer 11 may also be developed in edge regions not shown. In this manner, it is possible to measure capacitances between the beam structures and between beam structures 55 and the rest of epitaxy layer 11, the capacitances being a function of how much beam structures 55 are deformed. These capacitive signals may then be transmitted, in turn, by metallized conductor tracks not shown, to electronic circuits 20 also formed in epitaxy layer 11, via surface-doped conductive layers 52 and contact openings 14. In this manner, a capacitive force sensor, e.g. an acceleration sensor, is produced.

Figure 14:
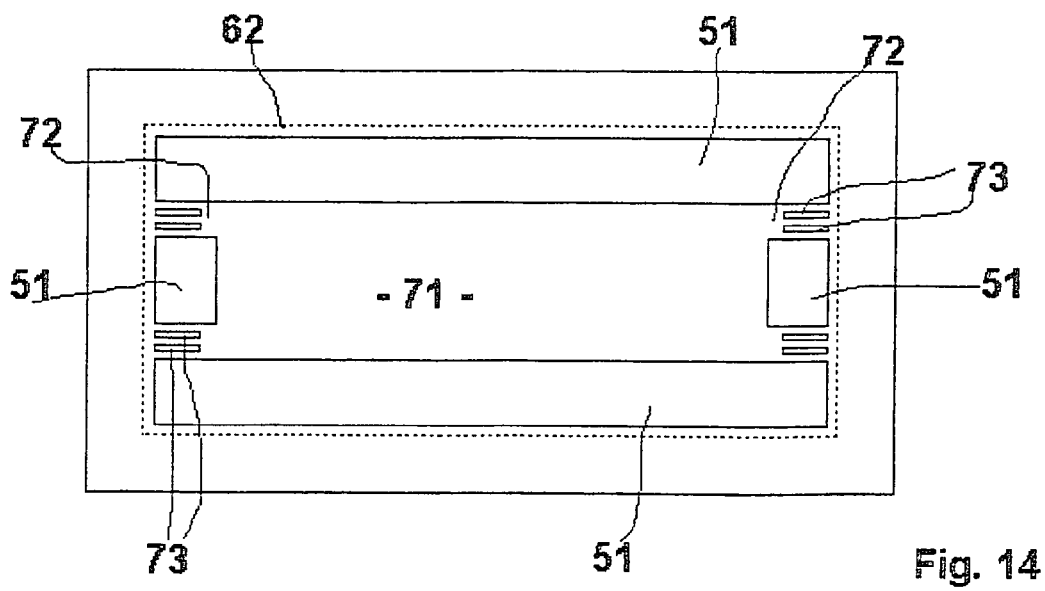
FIG. 14 shows a further sensor according to the present invention.

Shown in FIG. 14 is a further example of a sensor, which starts out from a substrate according to FIGS. 6 and 8. A movable element, in which trenches 51 extending to void 3 are introduced, is patterned out of an upper silicon layer, which is either formed out of only membrane layer 4, or made of a corresponding epitaxy layer 11. In the plan view of silicon substrate 1 in FIG. 14, the boundaries of void 3 are represented by dotted line 62. Trenches 51 allow a seismic weight 71 suspended from four beam elements 72 to be formed out of the upper silicon layer. Piezoresistive elements 73 are situated on each of beam elements 72. These piezoresistive elements 73 allow the action of a force, in particular an acceleration force acting on seismic weight 71, to be detected, for when a force acts on weight 71, suspension arms 72 are deformed and corresponding changes in the resistance of piezoresistive elements 73 may be detected. In this case, both forces perpendicular to substrate 1 and forces parallel to the surface of the substrate may be detected.

The advantage of the sensors shown in FIGS. 9 through 14 is that the sensor structures are all made of monocrystalline silicon. Therefore, piezoresistive resistor elements having high precision and long-term durability may be introduced. In addition, movable elements made of monocrystalline silicon are of a particularly high quality and only show small aging effects. In addition, the method of the present invention may be completely integrated with customary semiconductor manufacturing processes, so that both bipolar circuits and CMOS circuits may be integrated on the same substrate. In this manner, sensor elements and semiconductor circuit elements may be jointly integrated on one substrate. Furthermore, only customary semiconductor manufacturing processes are used.

What is claimed is:

1. A method for manufacturing a micromechanical sensor, comprising:
   introducing openings into a semiconductor substrate;
   subsequently performing a temperature treatment, wherein:
      geometric dimensions of the openings and a temperature duration and a time duration of the temperature treatment are selected in such a manner that a void forms in a depth of the semiconductor substrate; and
      providing a second layer above the semiconductor substrate, wherein a sensing region is formed by at least one of a region of the substrate above the void and a region of the second layer above the void.

2. The method as recited in claim 1, wherein:
   the temperature treatment is carried out at a temperature greater than 900° C.

3. The method as recited in claim 1, wherein:
   the temperature treatment is carried out a temperature greater than 1000° C.

4. The method as recited in claim 1, wherein:
   the openings extend from an upper surface of the semiconductor substrate into the semiconductor substrate to the depth, and
   a spacing of side walls of the openings is less than a depth of the openings.

5. The method as recited in claim 4, wherein:
   the openings at the upper surface of the semiconductor substrate are smaller than one µm in a direction and have a depth greater than 2 µm.

6. The method as recited in claim 1, wherein providing the second layer includes depositing an epitaxy layer on a surface of the semiconductor substrate.

7. The method as recited in claim 6, further comprising:
   introducing dopants one of prior to and after the deposition of the epitaxy layer.

8. The method as recited in claim 7, further comprising:
   forming piezoresistive elements in a monocrystalline semiconductor material by the dopants.

9. The method as recited in claim 8, wherein:
   the dopants are introduced into the semiconductor substrate prior to introducing the openings.

* * * * *